(12) United States Patent
Ellison

(10) Patent No.: US 7,885,402 B2
(45) Date of Patent: Feb. 8, 2011

(54) GAIN CONTROL

(75) Inventor: Richard D. Ellison, Maynard, MA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1357 days.

(21) Appl. No.: 10/719,771

(22) Filed: Nov. 21, 2003

(65) Prior Publication Data

US 2005/0123128 A1    Jun. 9, 2005

(51) Int. Cl.
  *H04M 1/00* (2006.01)
  *H04M 9/00* (2006.01)
(52) U.S. Cl. ....................................... 379/395
(58) Field of Classification Search ............ 379/390.03, 379/87, 347, 345, 38.01, 395; 381/107; 375/345; 704/225
See application file for complete search history.

(56) References Cited

U.S. PATENT DOCUMENTS

| 4,785,473 A | 11/1988 | Pfeiffer et al. |
| 5,267,322 A | 11/1993 | Smith et al. |
| 5,473,666 A | 12/1995 | Sczezbak, Jr. et al. |
| 5,487,102 A * | 1/1996 | Rothschild et al. .......... 379/395 |
| 6,222,472 B1 | 4/2001 | Han |
| 6,307,800 B1 | 10/2001 | Derner |

FOREIGN PATENT DOCUMENTS

EP     0 550 274     7/1993

* cited by examiner

Primary Examiner—Alexander Jamal

(57) ABSTRACT

Methods, systems, and devices are provided for controlling the power level of voice signal streams. A gain controller embodiment includes a measurement module, a gain factor setting module, and a gain adjustment module. The measurement module includes program instructions to measure a power level of a voice signal stream. The gain factor setting module includes program instructions to set a gain value by comparing the measured power level to a threshold. The gain adjustment module includes program instructions to adjust a power level of a voice signal stream by applying the gain value to the voice signal stream.

37 Claims, 5 Drawing Sheets

GAIN CONTROL

In the United States, the Federal Communications Commission (FCC) provides a registration procedure for equipment connected to the Public Switched Telephone Network (PSTN) in order to protect the telephone network from signal overload. Under FCC Part 68 (Title 47 of the Code of Federal Regulations Part 68), a manufacturer of telecommunication equipment is to adhere to a set of standards for connection of terminal equipment and associated wiring to the PSTN. FCC Part 68 also includes a number of guidelines for compliance with the standards.

For example, FCC Part 68 states that the power of other than live voice signals, e.g., encoded analog content, delivered to a 600 Ohm termination during the non-signaling mode and for other inband systems shall not exceed −13 dBm (decibel milliwatts) when averaged over any 3 second interval. One or more pieces of terminal equipment can be used to provide a termination. Terminal equipment includes communications equipment at the end of a communications link used to permit access to the PSTN. Examples of terminal equipment include T1, E1, and J1 media cards. E1 and J1 cards are used in countries other than the United States and, therefore, different regulations can apply to their usage.

Under Part 68, the terminal equipment has to be certified by the FCC and/or the Administrative Counsel for Terminal Attachments (ACTA). Terminal equipment can be certified by providing a sample of the terminal equipment to a certification body of the FCC or ACTA for testing or by attesting to the equipment's conformity to the standards of Part 68.

When providing a sample, the certification body evaluates the equipment and certifies the equipment based on the results of tests performed on the sample by the certification body. When attesting to the equipment's conformity, the manufacturer of the equipment or a party that is going to use the equipment can make measurements and/or perform other tests to ensure that the equipment complies with the technical standards of Part 68. The attestation by the manufacturer, or party using the equipment, that the equipment will conform to the standards is sufficient to certify the equipment with the FCC and ACTA.

In order to comply with these guidelines, manufacturers, or certification bodies, can test the terminal equipment by using test signals that are passed through a particular piece of terminal equipment to test for compliance with FCC Part 68. For example, the test signal can be a varying analog or digital signal provided to a T1 port on a media card and the signal power can be measured to see what occurs with the signal on the output side of the port. These tests are accomplished by sending and receiving test signals. However, the test signals may not equate to actual use conditions. Therefore, the equipment may not be compliant under some actual use situations. Additionally, since test signals are used to test the terminal equipment, the equipment cannot be sending and receiving actual communications during the testing period.

DETAILED DESCRIPTION

As mentioned above, the FCC has promulgated regulations relating to terminal attachments to the PSTN. To comply with FCC Part 68, manufacturers have used particular hardware and circuitry connected to the terminal equipment to send and receive test signals to and from the terminal equipment in order to test the power level of the signals. One example of terminal equipment includes a T1 line as part of an Integrated Digital Services Network (ISDN). However, the embodiments of the present invention can be used with various terminal equipment including T1, E1, and J1 media cards, among others. According to program embodiments of the present invention instructions are provided as a gain controller to control the power level of an output signal. According to various embodiments, program instructions can adjust a power level of the output signal by changing a gain value applied to the signal.

Telecommunications networks use computer based media platforms to provide enhanced telecommunication services such as toll-free call routing, prepaid calling card services, voice mail, interactive voice response (IVR) applications, DTMF (dual tone multiple frequency) services, and virtual private network call routing in addition to regular phone services.

Figure 1:
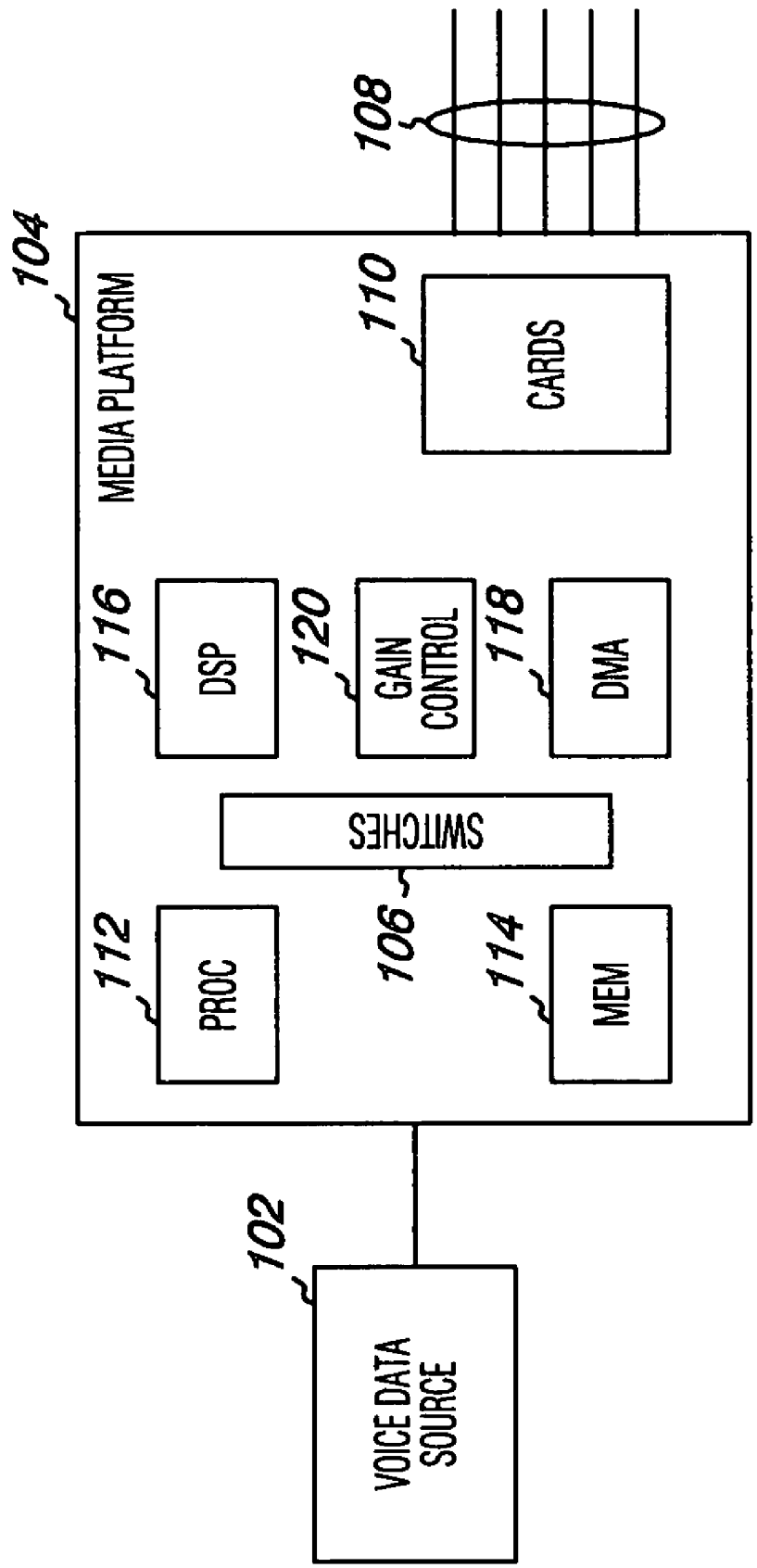
FIG. 1 is a block diagram embodiment of a media platform having a gain controller.

FIG. 1 is a block diagram embodiment of a media platform having a gain controller. The embodiment shown includes a media platform 104 coupled to a voice signal source 102 and a number of media channels 108. The media platform 104 can include hardware and software resources in the form of trunk lines, switches, routers, processors, servers, digital signal processing modules, memory, media cards, and the like which can operate on or according to computer executable instructions.

For example, in the embodiment of FIG. 1, the media platform 104 is illustrated as having a switch 106 and a number of media channels 108. The switch 106 can provide an interface to a media channel among the number of media channels 108, such as, for example, telephonic channels, the Internet, or private wired or wireless connections. The number of media channels 108 can be provided in the form of media cards 110, such as T1, E1, and/or J1 media cards. Embodiments of the invention, however, are not limited to these examples.

As shown in the embodiment of FIG. 1, the media platform can include a processor 112 and a memory 114. The processor 112 can operate on computer executable instructions as part of the control logic for controlling operations of the media platform 104. Computer executable instructions can be stored in the memory 114 and executed by the processor 112.

Memory, as referred to herein, can include non-volatile and volatile memory such as read only memory (ROM) and random access memory (RAM), including flash memory and optical memory, among others. The hardware and software resources illustrated in the media platform embodiment of FIG. 1, include a digital signal processing (DSP) module 116 and a direct memory access (DMA) module 118 such as described below.

Media platforms can be used to provision (e.g., provide or supply) telecommunication services to users. For example, a media platform can receive a call signal in the form of a signal stream which can be originated by a local exchange carrier (LEC) and can propagate the call signal to a switch such as switch 106. The DSP module 116 and DMA module 118 are used in connection with instructions from memory 114 that are executable on processor 112, to process and/or respond to a call signal in connection with provisioning telecommunications services to a particular media channel 108, e.g., in order to complete the call signal's routing to an intended destination.

By way of example and not by way of limitation, the DSP module 116 can analyze call signals, for processing and routing, using various algorithms such as a Fast Fourier Transform. The DMA module 118 can include circuitry to route a signal (call signal or otherwise) on the media platform, for example, from one memory to another, without using the processor 112 in every signal transfer. As described above a number of telecommunication services may be provided by applications on a media platform by using the hardware and software resources described above.

In various embodiments, IVR applications include applications which can process, e.g., using a DSP module, spoken voice signals and provide the call signal to a particular media channel 108 in order to complete the call signal's routing to an intended destination. Further, DTMF services include applications which can process the type of audio signals, for example, using a DSP, that are generated from pressing buttons on a touch-tone telephone and provide the call signal to a particular media channel 108 in order to complete the call signal's routing to an intended destination.

Examples of telecommunication service applications which involve IVR and/or DTMF include caller information services such as calling a local cinema's telephone number for a listing of movie showings and times, calling a bank's telephone number to access account information, and/or calling a weather information number to receive weather forecasts. By way of example and not by way of limitation, an IVR service application can allow a caller to speak voice commands in response to recorded prompts, e.g., such as speaking a bank account number, a movie title, etc., after a recorded prompt asking for "what account number," "what movie listing," etc.

In various examples, a DTMF service application can have a recorded prompt asking the caller to input a bank account number using keys on a phone, or to input a movie title using keys on the phone corresponding to the first several letters of the movie title. Sometimes a telecommunications service application involves a combination of IVR and DTMF responses.

Accessing voice mail remotely is another example which can use IVR, DTMF, or a combination thereof. That is, a caller may dial a voice mail access number from a phone and either speak, press keys on their phone, or a combination thereof, in response to recorded prompts in order to access their voice mail messages. Embodiments of the invention are not limited to the above referenced types of telephone service applications.

In each of these examples, various types of signals are transmitted through the media platform. Live voice signals and non-live voice signals are two such signal types. The FCC has different regulations with respect to the various signal types. For example, as stated in the introduction section with respect to other than live voice signals, the maximum power of the signals delivered to a 600 Ohm termination is not to exceed −13 dBm when the power is averaged over a 3 second interval.

As described in detail below, program embodiments, including software and/or firmware, provide a gain controller 120 to test and adjust the gain and/or power level of a signal while the media platform is connected to the PSTN through one of the media channels 108. The gain controller 120 includes instructions which can be used to increase or decrease the gain applied to a signal stream through use of a gain factor. The program instructions can apply a gain factor which can, for example, be an amount of power added or subtracted to the power level of the signal stream. According to various program embodiments, the instructions can also multiply or divide the power level by a gain factor to change the power level. Embodiments, however, are not limited to these examples.

Program embodiments provided as the gain controller 120 also include instructions to monitor the power level and/or level of gain at a point in time along the signal stream and/or by monitoring an average, such as a rolling average, of the gain at a section of points along the signal stream. Program embodiments include instructions to compare the gain values such as by comparing a gain value to a number of threshold values to determine whether the gain should be adjusted, by how much, etc.

Figure 2:
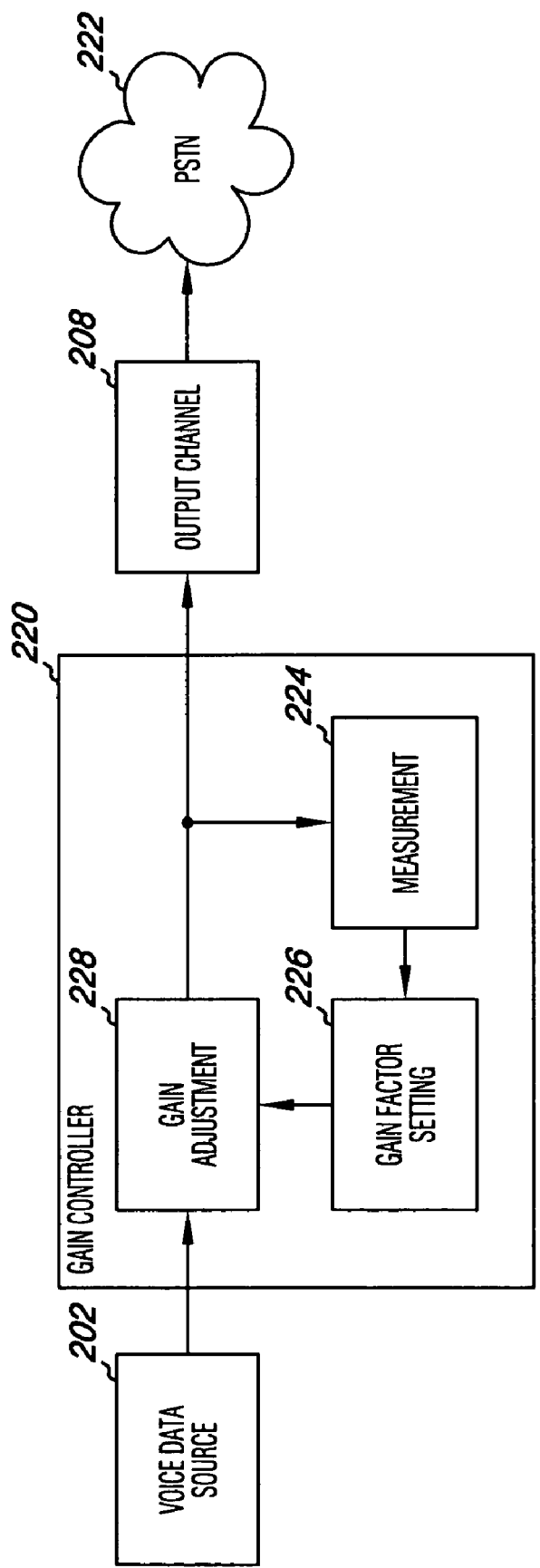
FIG. 2 is a block diagram embodiment of a gain control component.

FIG. 2 is a block diagram embodiment of a gain controller. The gain controller 220 can be used as gain controller 120 in FIG. 1. In the embodiment shown in FIG. 2, the gain controller 220 uses computer executable instructions to monitor the power level of the signal stream between a voice signal source 202 and an output channel 208, that is in communication with the PSTN 222. For example, output channel 208 can be one of the channels 108 described in FIG. 1. The embodiment of the gain controller 220 shown in FIG. 2 includes a measurement module 224, a gain factor setting module 226, and gain adjustment module 228. It is noted that the functions of the measurement module 224, the gain factor setting module 226, and/or the gain adjustment module 228 can be provided in a single module and/or separate modules as shown. Embodiments, however, are not so limited.

Program embodiments are provided to the measurement module 224 which can execute instructions to measure the power level and/or to track the gain level of the signal stream passing between the voice signal source 202 and the output channel 208. In various embodiments, program instructions can execute to measure the signal power traveling between the voice signal source 202 and output channel 208. The program instructions can execute to measure power level and/or gain level in various manners. For example, program instructions provided to the measurement module 224 can execute to receive and sample a voltage directly from the signal stream. The sampling of the voltage of the signal stream can be accomplished by using a measurement apparatus, such as a volt meter as the same are known in the art, to measure the voltage level as the signal passes the volt meter. A measurement apparatus is not shown so as not to obscure the drawings. The power level can be derived from the square of the measured voltage based on the physical relationship $P=IV^2$. The program instructions can execute to calculate the power level from this relationship and can execute to store the measurements in memory, such as in memory 114 shown in FIG. 1 and/or registers (not shown) as the same are known in the art. As described in more detail below, the program instructions can further execute to compare the measured voltage level and/or calculated power level to a threshold value which can similarly be stored in memory and/or registers. As discussed in more detail below, program instructions provided to a gain factor setting module 226 and gain adjustment module 228 can be executed to provide a feedback which adjusts the power level of the signal stream by changing a gain factor applied to the signal stream.

Additionally, program instructions can execute to identify a trend in the change of the signal power level from power level measurements. For example, program instructions can execute to periodically measure the signal power level. From these periodic measurements, program instructions can identify a change, e.g., if the power level is increasing and/or decreasing over time, and can calculate adjustments based on the measurements.

For example, in some embodiments, instructions execute to take measurements at 8 ms intervals. Thus, 80 milliseconds of measurement will provide 10 data points. Program embodiments can be executed to determine a trend from analyzing the 10 data points. Program instructions can also execute to average every 10 data points such that every 80 ms an average power level data point is produced. Over 800 ms, 10 such average signal power level data points will be available. According to various embodiments, program instructions can execute to use either individual data points, average data points, and/or both types of data to adjust the power level of the signal stream.

In some embodiments, program instructions execute to continuously measure the power level of the signal stream rather than measuring in intervals, such as 8 ms. These measurements can also be averaged and used to adjust the power level of the signal stream. Embodiments are not so limited.

Once the measurements have been taken, the power level can be adjusted to bring the power level to or near a target output level. In various embodiments, a target output level can be predetermined and stored in memory and used as a reference point. For example, a target output power level of −13 dBm over a 3 second interval can be stored in memory as the target output level.

Program embodiments, via gain factor setting module 226 execute instructions to determine what amount of gain should be applied to the power level based on the measured power level information from the measurement module 224 to bring the power level to or near the target output level. In various embodiments, a gain value currently being applied to the power level can be used as a base gain from which a gain adjustment value can be calculated. Again, using the measurement information from the measurement module 224, program instructions can be executed to adjust the gain in various ways.

For example, program instructions, can add or subtract a gain value to the power level. Additionally, program instructions can multiply or divide the power level by a gain value. In various embodiments, the gain value can be a whole, fractional/decimal number, or a combination of a whole number with a fractional/decimal component. Embodiments are not so limited.

Program embodiments are also provided to the gain adjustment module 228. Once the gain value to be applied to the power level is established by the gain factor setting module 226 the information is communicated to the gain adjustment module 228. Program instructions provided to the gain adjustment module 228 execute to adjust the signal stream by the determined amount of gain, e.g., based on the gain value information received from the gain factor setting module 226. For example, program instructions can be executed to multiply the power level by a particular gain value.

Program instructions can be provided to the gain adjustment module 228 to adjust the gain value that is being applied to a signal stream to bring the signal level toward a target output level, e.g., −13 dBm over a 3 second interval. In various embodiments, the gain value can be changed in one adjustment. The gain value can also be adjusted over a period of time, e.g., in several gradual increments rather than in one increment attempting to bring the signal power level to the target output level.

For example, program instructions can execute to change the power level from a measured power level of −3 dBm to −13 dBm in one incremental change by adding a gain of −10 dBm to the signal stream. Alternatively, program instructions can execute to adjust a gain in an incremental manner over time to approach a target output value. For example, from a measured signal power level of −3 dBm, program instructions can execute to add −2 dBm every 10 milliseconds (ms) until a total gain value of −10 dBm has been added and the target output signal power level of −13 dBm has been reached.

Figure 3:
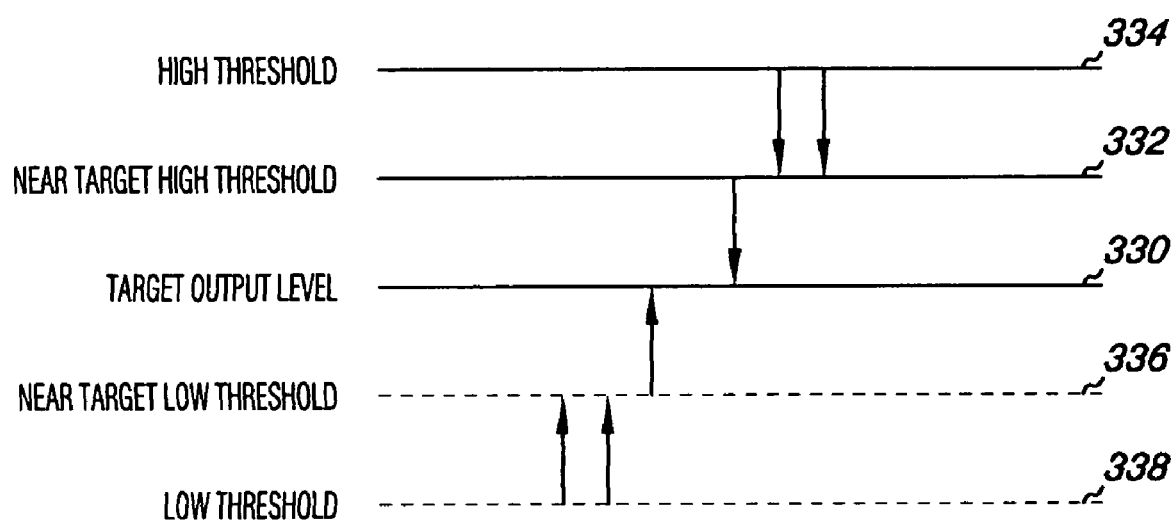
FIG. 3 illustrates an embodiment for various thresholds associated with an output level.

FIG. 3 is an embodiment of a method of adjusting the power level of a signal stream. In this embodiment, a target output level on line 330 is bounded by a high threshold value on line 334 and a low threshold value on line 338. Due to the fluctuating nature of many signal streams, the gain that is provided to the signal stream can be periodically adjusted to maintain the power level at or near the target output level on line 330. As illustrated by the arrows in FIG. 3, when the power level is approaching the high threshold on line 334, the gain provided to the power level can be increased in the negative direction to reduce the increase of, or decrease, the power level. When the power level is approaching the low threshold on line 338, the gain provided to the power level can be increased in the positive direction to reduce the decrease of, or to increase, the power level.

FIG. 3 illustrates an embodiment where computer executable instructions can be used to define a number of other thresholds to aid in maintaining the output at or near the target output level on line 330. For example, in FIG. 3, a near target high threshold on line 332 and a near target low threshold on line 336 are provided. In this embodiment, the gain can be increased or decreased positively or negatively in a tiered manner such that the farther the measured power is from the target output level on line 330, the more the gain is adjusted to aid the measured output in returning to at or near the target output level on line 330.

As shown in the embodiment of FIG. 3, when the power level climbs above the target output level on line 330, but below the near target high threshold on line 332, the gain can be increased slightly in the negative direction to aid in reducing the power level. However, if the power level continues to increase above the near target high output level on line 332, the change in the gain value can be increased in the negative direction in a greater amount to provide further aid in reducing the power level.

Further, when the power level drops below the target output level on line 330, but above the near target low threshold on line 336, the gain can be increased slightly in the positive direction to aid in increasing the power level. However, if the power level continues to decrease below the near target low output level on line 332, the change in the gain value can be increased in the positive direction in a greater amount to provide further aid in increasing the power level. The arrows shown in FIG. 3 are provided to illustrate that there can be different amounts of change in gain based upon the power level with respect to the various thresholds, but are not to be construed as a particular quantity or ratio of change with respect to the areas in which they are positioned.

Figure 4:
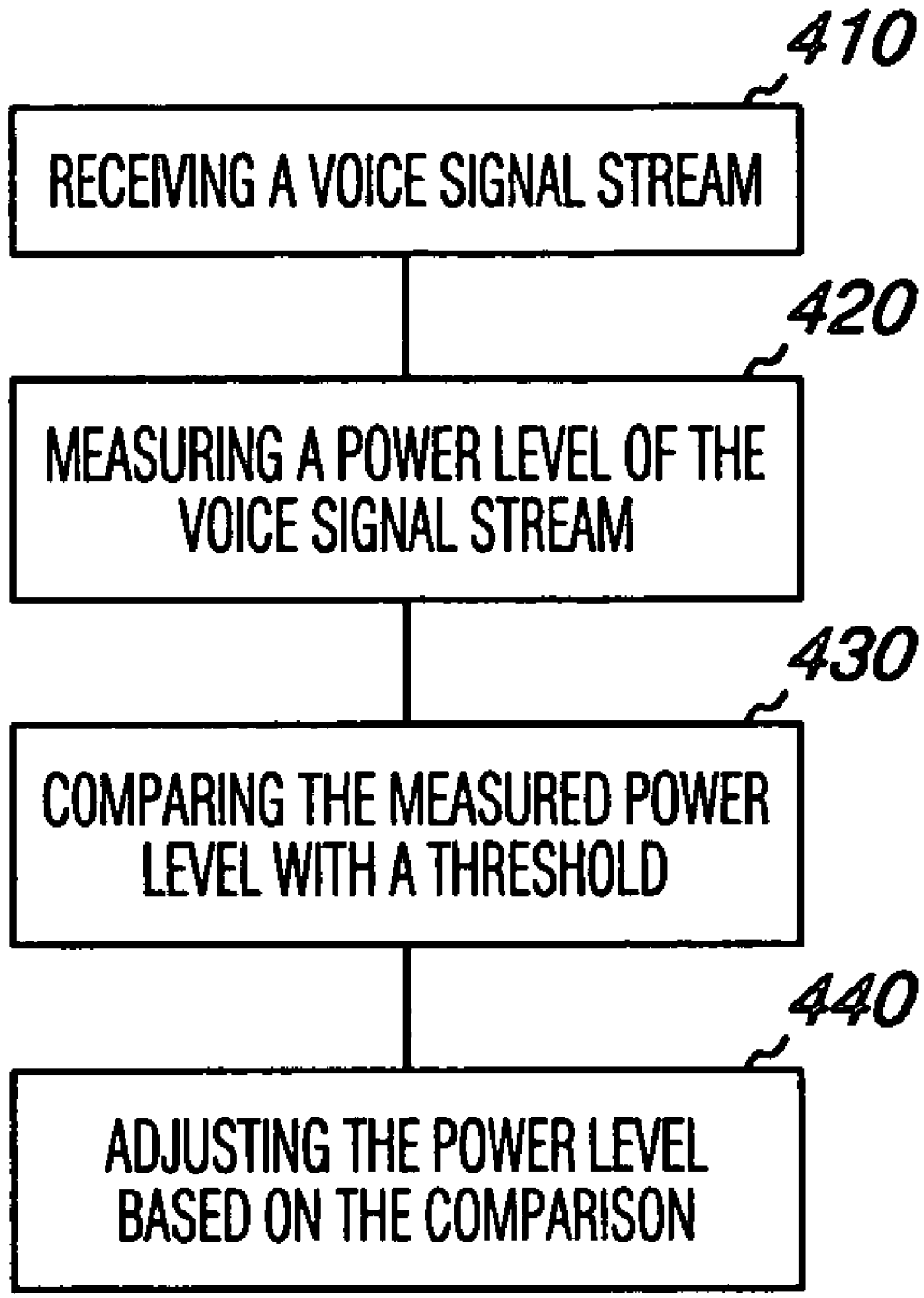
FIG. 4 illustrates a method embodiment for adjusting the power level of a voice signal stream.

FIG. 4 illustrates a method embodiment for adjusting the power level of a voice signal stream. Unless explicitly stated, the method embodiments described herein are not constrained to a particular order or sequence. Additionally, some of the described method embodiments or elements thereof can occur or be performed at the same point in time. One of ordinary skill in the art will appreciate that one or more of the various components within the embodiments of the invention can include computer readable media, on which a set of computer executable instructions can reside.

FIG. 4 is a block diagram of a method embodiment for adjusting the power level of a voice signal stream. The method includes receiving a voice signal stream in block 410. Receiving a voice signal stream can include receiving a voice signal stored in memory, from a text-to-speech application program, or from a streaming signal provided by a computer or network, among other sources.

In block 420, the method includes measuring a power level of the voice signal stream. The method can include measuring the power level of a number of segments of the voice signal stream, such as at a number of points in time.

The method also includes comparing the measured power level with a threshold at block 430. The measured power level can be compared to a number of thresholds, e.g., one, two, three, four, etc., and a number of measured power level can be compared to the number of thresholds. If the power level is measured in a number of segments within the voice signal stream, in some embodiments, the measured power level in each segment can be compared with the threshold.

In block 440, the method also includes adjusting the power level of the voice signal stream based on the comparison. Adjusting the power level can include applying a gain value to the stream. The power level of the voice signal stream can be adjusted in differing increments based on the proximity of the measured power level to the threshold. The power level can also be adjusted before the signal stream enters an output channel, e.g., a T1 channel connected to a PSTN. The power level can also be gradually adjusted over time based on the comparison to bring the power level toward a target output level. The amount of adjustment can be changed based upon the proximity of the power level to the target output level. In some embodiments, a change in the amount of adjustment can be made when the power level is outside a first set of thresholds with respect to the target output level.

The method can also include averaging the measured power levels of a number of segments and comparing the average to a threshold. In various embodiments, a rolling average can be used where values are added to a group of values of a defined size to be averaged. Once the group is full, an average can be calculated. After the average is calculated a number of values, often the oldest of the values, are removed from the group and new values are inserted in their place. Once the group has been filled again, another average can be calculated. For example, a power level of a newest measured segment can be used to replace a power level of an oldest measured segment and a new average can be calculated for the group.

Figure 5:
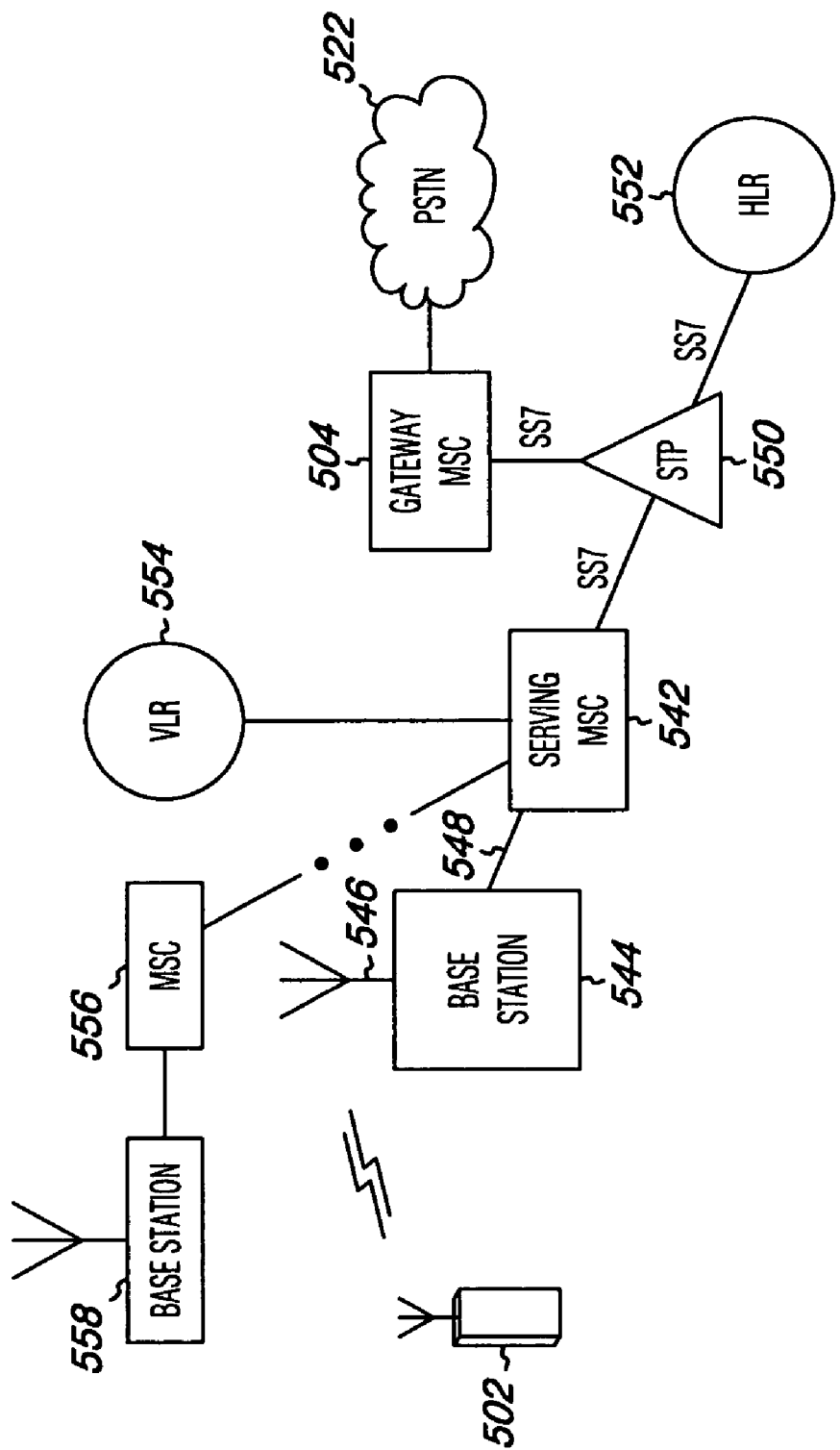
FIG. 5 is a block diagram embodiment of a telecommunications network including a media platform according to embodiments described herein.

The embodiment of FIG. 5 is provided for reference as to one type of computing equipment environment which can benefit from embodiments of the present invention. However, the embodiments of the invention are not limited to the mobile network shown or to the field of mobile networking. Further, implementations of the embodiments of the present invention can be provided in one or more of the components shown and described with respect to FIG. 5.

FIG. 5 is a block diagram of a mobile network embodiment illustrating a mobile device 502, communicating with a mobile switching center (MSC) 542. One type of mobile network includes an IS-41/CDMA network as the same are known and understood by one of ordinary skill in the art.

In a typical wireless telecommunications system, the MSC is connected to a plurality of base stations that are dispersed throughout the geographic area serviced by the system. The geographic area serviced by a wireless telecommunications system is partitioned into a number of spatially distinct areas called "cells." Each MSC is responsible for, among other things, establishing and maintaining calls between mobile devices and between a mobile device and a wireline terminal, which is connected to the system via the local and/or long-distance networks. An MSC is a telephone component specialized for wireless and mobility support. An MSC, for example, performs various functions, including mobility management, call handoffs, call admission, call control, resource allocation, and so forth. As shown in FIG. 5, a call is initiated from mobile device 502 and a signal is received by the antenna 546 of base station 544. The call is sent via a communications link 548 to a serving MSC 542. The call is received by the MSC 542 and then relayed from the MSC to base stations and to a mobile device via wireless communications links.

In order to provide mobile service to a mobile device 502, the serving MSC 542 transmits a signal to a home location register (HLR) 552 via a signaling link such as a signal transfer point (STP) 550. A STP is a node in the signaling system 7 (SS7) telephone network that routes messages between exchanges, and between exchanges and databases that hold subscriber and routing information. A HLR is one such database in a cellular system that contains subscribers within the provider's home service area. A subscriber's contact information is located in the HLR and can either direct the call signal to a base station in the home area or direct the call signal to a visitor location register (VLR) to identify the geographical region that the subscriber is located.

The signal informs the HLR 552 of the network address associated with the MSC 542 currently serving the mobile device 502 and also requests requisite subscriber information for providing mobile service to the roaming mobile device 502. The HLR 552 updates its database to store the network address representing the serving MSC 542 and also copies the requested subscriber information to the VLR 554 associated with the serving MSC 542. The network address representing the serving MSC 542, stored in the HLR 552, is utilized by the mobile network to reroute any incoming call intended for the mobile device 502 to the serving MSC 542.

Accordingly, whenever a telecommunications subscriber dials a telephone number for the mobile device 502, the HLR 552 is queried by the mobile network to determine the current location of the mobile device 502. Utilizing the stored network address in the HLR 552, representing the serving MSC 542, the HLR 552 requests a roaming number from the serving MSC 542 in response to the receipt of the query signal.

The roaming number provided by the serving MSC 542 is then used by the telecommunications network to route the incoming signal towards the serving MSC 542 via its base station 544 and antenna 546. The serving MSC 542 then pages the mobile device 502 and establishes a voice connection with the mobile device 502, if available. In the embodiment of FIG. 5, the STP 550 can route the signal to a gateway MSC 504. As shown in FIG. 5, the gateway MSC 504 can serve as a network switch for connecting to a public switched telephone network (PSTN) 522.

If the mobile device 502 roams out of the serving MSC 542 coverage area and into another MSC 556 coverage area, the HLR 552 will direct the communication to a VLR 554, and the VLR will hand-off the communication to MSC 556 and base station 558. The STP 550 can then route the signal to a gateway MSC 504 for connecting the call to the PSTN 522.

Along the route to connection of the call signal to the PSTN 522, a gain controller, as described above in FIGS. 1 and 2, can be used to adjust the gain. This can enable a system such as that shown in FIG. 5 to comply with the maximum gain standards provided in Part 68. For example, the gain controller can be integrated into the gateway MSC 504 or connected between the gateway MSC 504 and the PSTN 522.

Although specific embodiments have been illustrated and described herein, those of ordinary skill in the art will appreciate that any arrangement calculated to achieve the same techniques can be substituted for the specific embodiments shown. This disclosure is intended to cover adaptations or variations of various embodiments of the invention. It is to be understood that the above description has been made in an illustrative fashion, and not a restrictive one.

Combination of the above embodiments, and other embodiments not specifically described herein will be apparent to those of skill in the art upon reviewing the above description. The scope of the various embodiments of the invention includes various other applications in which the above structures and methods are used. Therefore, the scope of various embodiments of the invention should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the embodiments of the invention require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. A gain controller, comprising:
a measurement module including program instructions to measure a power level of an outgoing voice signal stream before the outgoing voice signal stream enters an output channel that is communicating the outgoing voice signal stream to a Public Switched Telephone Network (PSTN);
a gain factor setting module including program instructions to set a gain value by comparing the measured power level to a threshold; and
a gain adjustment module including program instructions to adjust the power level of the outgoing voice signal stream by applying the gain value to the outgoing voice signal stream to operate within compliance of the PSTN before the outgoing voice signal stream enters the output channel in communication with the PSTN.

2. The controller of claim 1, wherein the gain factor setting module includes program instructions to compare the measured power level to at least two thresholds in order to set the gain value.

3. The controller of claim 1, wherein the gain factor setting module includes program instructions to store measured power levels and a previously applied gain value to a memory.

4. The controller of claim 1, wherein the gain adjustment module includes program instructions to apply the gain value, set by the gain factor setting module, to the voice signal stream to maintain the power level between a high threshold and a low threshold.

5. The controller of claim 1, wherein the gain adjustment module includes program instructions to multiply the power level by the gain value.

6. The controller of claim 1, wherein the gain adjustment module includes program instructions to add the gain value to the power level.

7. A gain control system, comprising:
a switch to receive a voice signal stream from a voice signal source;
a gain adjustment module to receive an outgoing voice signal stream from the switch, the gain adjustment module including program instructions to adjust a power level of the outgoing voice signal stream by applying a gain value to the outgoing voice signal stream;
a measurement module including program instructions to measure a power level at a number of segments of the outgoing voice signal stream before the outgoing voice signal stream enters an output channel that is communicating the outgoing voice signal stream to a Public Switched Telephone Network (PSTN); and
a gain factor setting module coupled to the gain adjustment module wherein the gain factor setting module includes program instructions to set the gain value by comparing the measured power level to a threshold to operate within compliance of the PSTN before the outgoing voice signal stream enters the output channel in communication with the PSTN.

8. The system of claim 7, wherein the gain adjustment module can adjust the gain before the voice signal stream has entered an output channel.

9. The system of claim 7, further including memory to store a number of power level measurements taken at the number of segments in the voice signal stream.

10. The system of claim 9, further including program instructions to add the number of power level measurements together to provide a total power level.

11. The system of claim 10, further including program instructions to average the added power level measurements to provide an average power level.

12. The system of claim 7, further including program instructions to compare the measured power level to two different high threshold levels.

13. The system of claim 7, further including program instructions to compare the measured power level to a high threshold level and a low threshold level.

14. A gain control system, comprising:
a voice signal source to produce an outgoing voice signal stream, the voice signal source coupled to a Public Switched Telephone Network (PSTN);
a media platform coupled to the PSTN and the voice signal source, the media platform having:
a switch to receive the voice signal stream from the voice signal source;
a measurement module including program instructions to measure a power level of an outgoing voice signal stream before the outgoing voice signal stream enters an output channel that is communicating the outgoing voice signal stream to the PSTN;
means for adjusting a power level of the voice signal stream to operate within compliance of the PSTN before the outgoing voice signal stream enters an output channel in communication with the PSTN; and
the output channel in communication with the PSTN to receive the voice signal stream from the media platform.

15. The system of claim 14, wherein means for adjusting the power level of the voice signal stream includes a gain controller having a set of computer executable instructions.

16. The system of claim 15, wherein the gain controller includes a measurement module, a gain factor setting module, and a gain adjustment module.

17. The system of claim 16, wherein the measurement module measures the power level of the voice signal stream.

18. The system of claim 16, wherein the gain factor setting module sets a gain value for application to the power level based upon measurement information from the measurement module.

19. The system of claim 16, wherein the gain adjustment module adjusts the gain applied to the power level based upon the gain value selected by the gain factor setting module.

20. The system of claim 14, wherein means for adjusting the power level includes program instructions stored in memory within the media platform and executed by a processor.

21. A method for adjusting the power level of a voice signal stream, comprising:
  receiving an outgoing voice signal stream;
  measuring a power level of the outgoing voice signal stream at a number of points in time before the outgoing voice signal stream enters an output channel that is communicating the outgoing voice signal stream to a Public Switched Telephone Network (PSTN);
  comparing at least one of the power levels measured at the number of points in time with a threshold; and
  adjusting the power level of the outgoing voice signal stream based on the comparison to operate within compliance of the PSTN before the outgoing voice signal stream enters the output channel in communication with the PSTN.

22. The method of claim 21, wherein comparing at least one of the power levels measured at the number of points in time includes comparing at least one of the measured power levels to at least two thresholds.

23. The method of claim 21, wherein adjusting the power level of the voice signal stream includes applying a gain value to the stream.

24. The method of claim 21, wherein measuring the power level at a number of points in time includes measuring a power level of a number of segments of the voice signal stream.

25. The method of claim 24, wherein comparing at least one of the power levels to a threshold includes comparing the measured power level at each segment with the threshold.

26. The method of claim 21, wherein the method further includes averaging the power levels measured at the number of points in time and comparing the average to a threshold.

27. A computer readable medium having a program to cause a device to perform a method, comprising:
  receiving an outgoing voice signal stream;
  measuring a power level of the outgoing voice signal stream at a number of points in time before the outgoing voice signal stream enters an output channel that is communicating the outgoing voice signal stream to a Public Switched Telephone Network (PSTN);
  comparing at least one of the measured power levels with a threshold; and
  adjusting the power level of the outgoing voice signal stream based on the comparison to operate within compliance of the PSTN before the outgoing voice signal stream enters the output channel in communication with the PSTN.

28. The computer readable medium of claim 27, wherein adjusting the power level of the voice signal stream includes adjusting the power level in differing increments based on a proximity of the measured power level to the threshold.

29. The computer readable medium of claim 27, wherein the method further includes defining an average measured power level of a number of segments.

30. The computer readable medium of claim 29, wherein a power level of a newest measured segment replaces a power level of an oldest measured segment and a new average is calculated.

31. The computer readable medium of claim 27, wherein adjusting the power level includes adjusting before the signal stream enters a T1 channel connected to a Public Switched Telephone Network.

32. The computer readable medium of claim 27, wherein receiving a voice signal stream includes receiving a voice signal stream stored in memory.

33. The computer readable medium of claim 27, wherein receiving a voice signal stream includes receiving a voice signal stream output from a text-to-speech application program.

34. A method for adjusting the power level of a voice signal stream, comprising:
  measuring a power level of an outgoing voice signal stream at a number of points in time before the outgoing voice signal stream enters an output channel that is communicating the outgoing voice signal stream to a Public Switched Telephone Network (PSTN);
  comparing a number of the power levels measured with a number of thresholds; and
  gradually adjusting the power level of the outgoing voice signal stream over time based on the comparison to bring the power level toward a target output level to operate within compliance of the PSTN before the outgoing voice signal stream enters the output channel in communication with the PSTN.

35. The method of claim 34, wherein gradually adjusting the power level includes changing an amount of adjustment based upon a proximity of the power level to the target output level.

36. The method of claim 34, wherein comparing a number of power levels includes comparing the power levels to four thresholds.

37. The method of claim 36, wherein gradually adjusting the power level includes increasing an amount of adjustment when the power level is outside a first set of thresholds with respect to the target output level.

* * * * *

UNITED STATES PATENT AND TRADEMARK OFFICE
CERTIFICATE OF CORRECTION

| | | |
|---|---|---|
| PATENT NO. | : 7,885,402 B2 | Page 1 of 1 |
| APPLICATION NO. | : 10/719771 | |
| DATED | : February 8, 2011 | |
| INVENTOR(S) | : Richard D. Ellison | |

It is certified that error appears in the above-identified patent and that said Letters Patent is hereby corrected as shown below:

In column 1, line 2, below "GAIN CONTROL" insert -- INTRODUCTION --.

Signed and Sealed this
Tenth Day of January, 2012

David J. Kappos
*Director of the United States Patent and Trademark Office*